United States Patent [19]

Thaniyavarn

[11] Patent Number: 4,764,929
[45] Date of Patent: Aug. 16, 1988

[54] SEMICONDUCTOR LASER ARRAY APPARATUS WITH ADJUSTABLE PHASE PLATE

[75] Inventor: Suwat Thaniyavarn, Pasadena, Calif.

[73] Assignee: TRW Inc., Redondo Beach, Calif.

[21] Appl. No.: 924,956

[22] Filed: Oct. 30, 1986

[51] Int. Cl.[4] .............................................. H01S 3/098
[52] U.S. Cl. ........................................ 372/18; 372/19; 372/20; 372/36
[58] Field of Search ...................... 372/18, 19, 20, 49, 372/50; 350/36, 403, 162.11

[56] References Cited

U.S. PATENT DOCUMENTS 3,408,596 10/1968 Forward et al. .................... 350/403
4,641,311 2/1987 Ackley .................................. 372/18

OTHER PUBLICATIONS

W. Streifer et al., "Phased Array Diode Lasers," Laser Focus, Jun., 1984.

Peter R. Cross et al., "Dynamite Diodes," Photronics Spectra, Sep., 1984, pp. 79–86.

Primary Examiner—James W. Davie
Assistant Examiner—Xuan T. Vo
Attorney, Agent, or Firm—Noel F. Heal; Thomas N. Giaccherini

[57] ABSTRACT

A phase-locked semiconductor laser array in which the phase of oscillation of alternate laser elements is adjusted externally to the laser cavity. A phase plate having parallel ribs of tapered thickness is positioned in close proximity to the emitting facet of a laser array, and is adjusted in position until the ribs are registered with alternate laser elements, and the thickness presented to the emitted laser beams is sufficient to cause a phase change of 180 degrees. After light from the array has passed through the phase plate, the entire set of beams is in phase and produces a practically single-lobed far-field pattern.

5 Claims, 1 Drawing Sheet

SEMICONDUCTOR LASER ARRAY APPARATUS WITH ADJUSTABLE PHASE PLATE

BACKGROUND OF THE INVENTION

This invention relates generally to semiconductor lasers and, more particularly, to arrays of semiconductor lasers fabricated as single structures. There are a number of applications of semiconductor lasers that require relatively high output powers, such as space communications, laser printing, and optical recording. In recent years, much of the development effort in semiconductor lasers has been directed to increasing the power output from lasers in continuous wave (cw) operation, both for single laser structures and for phase-locked arrays of multiple lasers.

By way of general background, a semiconductor laser is a multilayered structure composed of different types of semiconductor materials, chemically doped with impurities to give them either an excess of electrons (n type) or an excess of electron vacancies or holes (p type). The basic structure of the semiconductor laser is that of a diode, having an n type layer, a p type layer, and an undoped active layer sandwiched between them. When the diode is forward-biased in normal operation, electrons and holes recombine in the region of the active layer, and light is emitted. The layers on each side of the active layer have a lower index of refraction than the active layer, and function as cladding layers in a dielectric waveguide that confines the light in a direction perpendicular to the layers. Various techniques are used to confine the light in a lateral direction as well, and crystal facets are located at opposite ends of the structure, to provide for repeated reflections of the light back and forth in a longitudinal direction in the structure. If the diode current is above a threshold value, lasing takes place and light is emitted from one of the facets, in a direction generally perpendicular to the emitting facet.

Various approaches have been used to confine the light in a lateral sense within a semiconductor laser, i.e. perpendicular to the direction of the emitted light and within the plane of the active layer. If a narrow electrical contact is employed to supply current to the device, the lasing action will be limited to a correspondingly narrow region, in a process generally referred to as "gain guiding." At high powers, gain-guided devices have strong instabilities and produce highly astigmatic, double-peaked beams. For most high-power semiconductor laser applications there is also a requirement for a diffraction-limited beam, i.e. one whose spatial spread is limited only by the diffraction of light, to a value roughly proportional to the wavelength of the emitted light divided by the width of the emitting source. Because of the requirement for a diffraction-limited beam, most research in the area has been directed to index-guided lasers. In these, various geometries are employed to introduce dielectric waveguide structures for confining the laser light in a lateral sense, i.e. perpendicular to the direction of light emission and generally in the same plane as the active layer.

A survey of the state of the laser array art can be found in a paper by W. Streifer et al. entitled "Phased Array Laser Diodes," published in Laser Focus/Electro-Optics magazine, June, 1984. A useful introduction to semiconductor lasers and laser arrays can be found in a paper by Dan Botez, entitled "Laser diodes are power-packed," IEEE Spectrum, June, 1985, pp. 43–53.

In general, an array of laser emitters can oscillate in one or more of multiple possible configurations, known as array modes. In the most desirable array mode, all of the emitters oscillate in phase. This is known as the 0°-phase-shift array mode, and it produces a far-field pattern in which most of the energy is concentrated in a single lobe whose width is limited, ideally, only by the diffraction of light. The least desirable array mode, from the standpoint of obtaining a single-lobed far-field pattern, is obtained when adjacent laser emitters are 180° out of phase. This is the 180°-phase-shift array mode, sometimes known as the antisymmetric mode, and it produces two relatively widely spaced lobes in the far-field distribution pattern. Multiple additional modes exist between these two extremes, depending on the phase alignment of the separate emitters.

There is an inherent tendency for a laser array to oscillate in the antisymmetric array mode. Any array mode having a non-zero field in the lossy regions between laser elements will have a much higher round-trip propagation loss in the laser cavity, compared with a mode which does not have a non-zero field in the regions between laser elements. It is only in the antisymmetric mode that the field diminishes to zero in the regions between lasing elements. Therefore, the propagation loss for oscillation in the antisymmetric mode is lower than for oscillation in the other modes. It is apparently for this reason that the antisymmetric mode emerges as the dominant mode in most laser arrays. Although this mode minimizes propagation losses, it produces a less than desirable far-field pattern, and most research efforts have been directed to structuring the laser array to favor the in-phase mode and to discriminate against the antisymmetric mode. One relatively successful approach is to employ a Y-junction array. However, modification of the laser structure usually introduces more complexity to the fabrication process, and it would be highly desirable to provide an alternative technique for producing a phase-locked array operating in the 0°-phase-shift array mode.

One approach that has been suggested is to coat one of the emitting facets of the array with a film that effects a phase shift in alternate elements of the array. One difficulty with this approach is that the thickness of the film has to be accurately selected and controlled to effect the desired phase shift. Application of the coating is extremely difficult to control, and there is no simple way to adjust the amount of phase shift after the application of the coating.

In view of the foregoing, it will be appreciated that there is still a need for an alternate approach to obtaining a desirable single-lobed far-field radiation pattern from a semiconductor laser array. The present invention fulfills this need.

SUMMARY OF THE INVENTION

The present invention resides in a phase-locked laser array having a natural tendency to oscillate in the antisymmetric mode, but including a tunable phase plate mounted in close proximity to an emitting facet of the array. Briefly, and in general terms, the structure of the invention comprises an array of semiconductor lasers having a plurality of parallel waveguides and at least one emitting facet, and a phased plate having a plurality of elements, the spacing of which matches alternate laser elements in the array. The array has a simple geometry having oscillation in the antisymmetric array mode, and the phase plate has the effect of interposing a phase delay of 180 degrees in alternated beams of the array emitted from the facet.

More specifically, the phase plate includes a plurality of tapering-thickness ribs of dielectric material, the ribs being positioned in registration with alternate lasing elements, to present a thickness corresponding to the desired 180-degree phase shift. The structure of the invention also includes means for securing the phase plate in close proximity to the emitting facet, in registration with the laser elements, to provide a phase shift of 180 degrees to alternate elemental outputs from the array of lasers. The far-field pattern of the array then assumes the predominantly single-lobed configuration associated with in-phase laser arrays.

From another standpoint, the invention lies in a method of assembling a laser array, comprising the steps of forming a phase plate to include a plurality of parallel ribs of tapering thickness, positioning the phase plate in close proximity to the emitting facet of an array of laser elements, adjusting the position of the phase plate laterally to align the ribs with alternate laser elements, adjusting the position of the phase plate in a direction parallel with the ribs, to select a rib thickness providing the desired 180-degree phase shift to alternate beams emitted from the laser array. Proper positioning of the phase plate may be verified by monitoring the far-field pattern and repeating the final adjusting step until the pattern becomes as near to a single-lobed one as possible. After the phase plate is positioned optimally with respect to the laser array, the final step of the assembly method is securing the phase plate in this position, using an adhesive or solder.

It will be appreciated from the foregoing that the present invention represents a significant advance in the field of phase-locked laser arrays. Specifically, the invention allows the use of uncomplicated techniques for fabricating the laser structure, but produces a desirable single-lobed far-field pattern by making the necessary phase adjustments external to the laser structure. Moreover, the invention permits simple and convenient tuning of the phase delay at assembly time, to optimize the far-field pattern produced by the device. Other aspects and advantages of the invention will become apparent from the following more detailed description, taken in conjunction with the accompanying drawings.

DESCRIPTION OF THE PREFERRED EMBODIMENT

Figure 1:
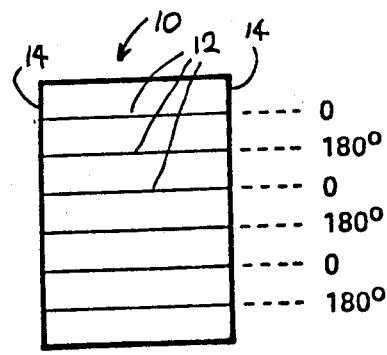
FIG. 1 is a simplified plan view of a phase-locked laser array in which the mode of oscillation is antisymmetric, with adjacent laser elements oscillating 180 degrees out of phase.
Figure 2:
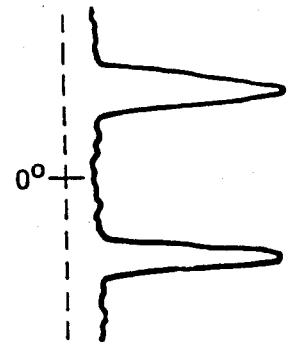
FIG. 2 is a typical far-field radiation pattern produced by the array of FIG. 1.
Figure 3:
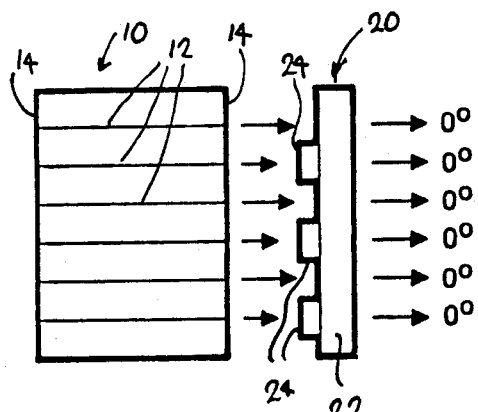
FIG. 3 is a simplified plan view of the device of the invention, including a phase correction plate positioned in close proximity to the laser array.

As shown in the drawings for purposes of illustration, the present invention is concerned with semiconductor laser arrays. FIG. 1 illustrates a phase-locked laser array, indicated by reference numeral 10, having a plurality of laser elements 12 formed in a single structure. The array 10 has reflective facets 14, and light is emitted from at least one of them as an array of phase-locked beams. As discussed earlier, such an array favors oscillation in an antisymmetric mode in which adjacent laser elements are out of phase by 180 degrees. This phase relationship produces a far-field radiation pattern like the one shown in FIG. 2, comprising two practically equal lobes, and usually a number of smaller sidelobes. The dual-lobed pattern is not the most desirable for most purposes. The ideal far-field includes only a single lobe, the angular width of which is limited only by diffraction effects. This is known as a diffraction-limited beam.

Various attempts have been made to obtain a single-lobed far-field pattern from an array of lasers fabricated in a single semiconductor structure. For the most part, workers in the field have attempted to restructure the laser array in such a way as to discriminate against the antisymmetric mode, and to favor the symmetric or in-phase mode of oscillation. Although some of these approaches show promise, they all involve more complicated laser structures, which necessarily entail increased manufacturing complexity and cost.

Figure 4:
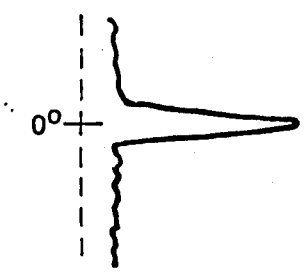
FIG. 4 is a typical single-lobed far-field radiation pattern resulting from use of the invention.

In accordance with the invention, basically the same laser array 10 is employed, using a single design that favors the antisymmetric mode of oscillation, and phase correction of alternate laser elements is made external to the laser structure, by means of a phase plate 20. The plate 20 includes a flat sheet 22 of transparent material, such as glass, uniform thickness, on which are formed a plurality of parallel ribs 24 of tapering thickness. The ribs are of dielectric material that induces a phase shift in light passing through them, and are positioned in close proximity to the laser array 10, with the ribs 24 perpendicular to the axis on which the laser elements 12 are arrayed, and registered with alternate laser elements. Consequently, the light emerging from the phase plate is in phase from element to element, and produces the far-field pattern of the type shown in FIG. 4, with the energy concentrated predominantly in a single lobe.

Figure 5:
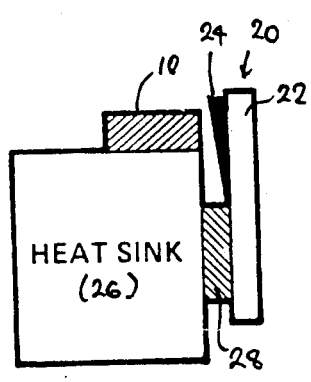
FIG. 5 is a simplified side elevational view of the structure of the invention.
Figure 6:
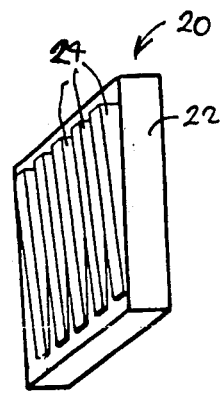
FIG. 6 is a simplified perspective view of a phase correction plate used in the structure of the invention.

FIG. 5 shows the structure of the invention after assembly of the phase plate 20 to the laser array 10. Typically, the laser array 10 is mounted on a heat sink, 26. The phase plate 20 may be conveniently secured to the same heat sink, such as by epoxy adhesive or solder, as indicated at 28. It will be noted from FIGS. 5 and 6 that the ribs 24 are tapered in thickness above the sheet 22. It is this taper that permits convenient tuning of the phase plate, by adjusting its position in a direction parallel to the ribs, until a desired optimum far-field pattern is obtained.

In the presently preferred embodiment of the invention, the sheet 22 is a thin glass microslide forming a substrate of uniform thickness, and the ribs 24 are of dielectric material, such as silicon nitride, each 1 cm long by 10 $\mu$m wide, formed on the surface of the substrate. The gap between the ribs is also 10 $\mu$m wide. The ribs 24 were deposited on the sheet 22 by a plasma chemical vapor deposition (CVD) process, using a shadow masking technique. The thickness of the ribs varies from about 1 μm at the thick end to a few hundred angstroms at the thin end. Ideally, the phase plate 20 is coated with an antireflective material on its face adjacent to the laser array, to minimize any effect on operation of the laser.

To assemble the structure of the invention, the phase plate 20 is first positioned in close proximity to the laser array 10. The spacing is not critical, except to the extent that a spacing that is too large will result in the light from the separate laser elements not being processed separately, as is required if their individual phase relationships are to be corrected. The plate 20 must also be adjusted in a direction perpendicular to the ribs, corresponding with the alignment of the laser array elements. This step can be performed with the aid of a microscope, or by observing the far-field pattern as the adjustment is made. Finally, the position of the phase plate 20 is adjusted in a direction parallel to the direction of the ribs 24, until an appropriate thickness of rib dielectric material is presented to the alternate laser elements. This step is best performed by simultaneously monitoring the far-field pattern until the pattern is predominantly single-lobed, indicating that a 180-degree phase shift has been interposed in the alternate light beams. The position of the phase plate 20 can then be fixed by applying solder or epoxy to the structure.

It will be appreciated from the foregoing that the present invention represents a significant advance in the field of semiconductor laser arrays. In particular, the invention provides an easily tunable phase corrector for use in conjunction with a laser array, to produce an array of beams that are all in phase and produce a desirable single-lobed far-field pattern. It will also be appreciated that, although an embodiment of the invention has been described in detail for purposes of illustration, various modifications may be made without departing from the spirit and scope of the invention. Accordingly, the invention is not to be limited except as by the appended claims.

I claim:

1. Semiconductor laser array apparatus comprising:
   an array of semiconductor lasers having an emitting facet, the array having a simple geometry favoring oscillation in the antisymmetric array mode;
   a phase plate having a plurality of elements of which the spacing matches alternate laser elements in the array, wherein the phase plate includes a plurality of parallel ribs of tapering thickness, whereby the array can be conveniently adjusted by moving the phase plate in a direction parallel to the ribs until the far-field pattern is optimized; and
   means for securing the phase plate in close proximity to the emitting facet, in registration with the laser elements, to provide a phase shift of 180 degrees to alternate elemental outputs from the array of lasers, whereby the far-field pattern of the array assumes the predominantly single-lobed configuration associated with in-phase laser arrays.

2. Semiconductor laser array apparatus as defined in claim 1, wherein:
   the phase plate includes a substrate of uniform-thickness material, such as glass; and
   the ribs are of dielectric material formed on the surface of the substrate.

3. Semiconductor laser array apparatus as defined in claim 1, wherein:
   the means for securing the phase plate includes an adhesive material.

4. A method for assembling semiconductor laser array apparatus, comprising the steps of:
   forming a phase plate to include a plurality of parallel ribs of tapering thickness;
   positioning the phase plate in close proximity to an emitting facet of an array of laser elements;
   adjusting the position of the phase plate laterally to align the ribs with alternate laser elements;
   adjusting the position of the phase plate in a direction parallel with the ribs, to select a rib thickness providing the desired 180-degree phase shift to alternate beams emitted from the laser array.

5. A method as defined in claim 4, and further comprising the steps of:
   verifying the proper position of the phase plate by monitoring the far-field pattern;
   repeating the final adjusting step until the pattern becomes as near to a single-lobed one as possible and
   securing the phase plate in position.

* * * * *